(12) United States Patent
Kurahashi et al.

(10) Patent No.: US 7,947,547 B2
(45) Date of Patent: May 24, 2011

(54) METHOD FOR MANUFACTURING A SEMICONDUCTOR DEVICE

(75) Inventors: Teruo Kurahashi, Kawasaki (JP);
Manabu Sakamoto, Kawasaki (JP);
Yasuyoshi Mishima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 113 days.

(21) Appl. No.: 12/137,807

(22) Filed: Jun. 12, 2008

(65) Prior Publication Data

US 2008/0242068 A1 Oct. 2, 2008

Related U.S. Application Data (63) Continuation of application No. PCT/JP2005/022860, filed on Dec. 13, 2005.

(51) Int. Cl.
*H01L 21/8238* (2006.01)

(52) U.S. Cl. ........ 438/199; 438/157; 438/176; 438/195; 438/283

(58) Field of Classification Search .............. 438/195, 438/283, 199, 176, 157
See application file for complete search history.

(56) References Cited

U.S. PATENT DOCUMENTS

| | | | |
|---|---|---|---|
| 6,441,441 B1* | 8/2002 | Suda | 257/370 |
| 2001/0015463 A1* | 8/2001 | Wakabayashi et al. | 257/371 |
| 2002/0086504 A1 | 7/2002 | Park et al. | |
| 2005/0064653 A1* | 3/2005 | Park et al. | 438/232 |
| 2005/0110098 A1 | 5/2005 | Yoshihara | |
| 2005/0167767 A1 | 8/2005 | Akasaka | |
| 2006/0068575 A1* | 3/2006 | Gluschenkov et al. | 438/585 |
| 2006/0134848 A1* | 6/2006 | Lander et al. | 438/216 |

FOREIGN PATENT DOCUMENTS

| | | |
|---|---|---|
| JP | 2000-31296 A | 1/2000 |
| JP | 2001-203276 A | 7/2001 |
| JP | 2002-252285 A | 9/2002 |
| JP | 2003-273350 A | 9/2003 |
| JP | 2005-79512 A | 3/2005 |
| JP | 2005-217309 A | 8/2005 |

OTHER PUBLICATIONS

H. Y. Yu; "Robust High-Quality HfN-HfO2 Gate Stack for Advanced MOS Device Applications," IEEE Electron Device Letters; vol. 25; No. 2; pp. 70-72.

* cited by examiner

*Primary Examiner* — N Drew Richards
*Assistant Examiner* — Jae Lee
(74) *Attorney, Agent, or Firm* — Westerman, Hattori, Daniels & Adrian, LLP (57) ABSTRACT

A semiconductor device fabrication method by which CMOS transistors with low-resistance metal gate electrodes each having a proper work function can be fabricated. A HfN layer in which nitrogen concentration in an nMOS transistor formation region differs from nitrogen concentration in a pMOS transistor formation region is formed. A MoN layer is formed over the HfN layer and heat treatment is performed. Nitrogen diffuses from the MoN layer into the HfN layer in which nitrogen concentration is low and a work function is set by the HfN layer according to nitrogen concentration which depends on the nitrogen content of the HfN layer before the heat treatment and the amount of nitrogen that diffuses into the HfN layer. On the other hand, nitrogen hardly diffuses from the MoN layer into the HfN layer which originally has a certain nitrogen content, and a work function is set by the HfN layer according to nitrogen concentration in the HfN layer before the heat treatment. By controlling the nitrogen content of each layer and the amount of nitrogen that diffuses, a low-resistance metal gate electrode having a predetermined work function can be formed in each of the nMOS transistor formation region and the pMOS transistor formation region.

6 Claims, 12 Drawing Sheets

METHOD FOR MANUFACTURING A SEMICONDUCTOR DEVICE

This application is a continuing application, filed under 35 U.S.C. §111(a), of International Application PCT/JP2005/022860, filed on Dec. 13, 2005.

TECHNICAL FIELD

This invention relates to a method for manufacturing a semiconductor device and, more particularly, to a method for fabricating a semiconductor device having metal gate electrodes.

BACKGROUND

Conventionally, polycrystalline silicon has widely been used as a material for forming gate electrodes of metal oxide semiconductor (MOS) devices. However, as such a MOS device becomes minuter, there is a fear that driving current will fall because of an increase in the resistance of a polycrystalline silicon gate electrode or the occurrence of a depletion layer. To avoid these problems, in recent years an attempt to form a gate electrode by using a metal material in place of polycrystalline silicon has been made.

With a metal gate electrode formed by using a metal material, the work function must be controlled for controlling threshold voltage. Accordingly, the method, for example, of forming metal gate electrodes of an n-channel MOS transistor (nMOS transistor) and a p-channel MOS transistor (pMOS transistor) by using different metal materials has traditionally been adopted.

In recent years the method of changing a work function by doping a metal material with nitrogen (N) has also been proposed (see IEEE Electron Device Letters, Vol. 25, No. 2, p. 70 (February 2004)). In addition to these methods, the following methods, for example, are proposed. When complementary metal oxide semiconductor (CMOS) transistors having metal gate electrodes are fabricated, layers are formed in an nMOS transistor and a pMOS transistor by using a same metal material. One region is masked and the other region is doped with nitrogen. By doing so, the metal gate electrode of the nMOS transistor differs from the metal gate electrode of the pMOS transistor in work function (see Japanese Unexamined Patent Publication No. 2000-31296). Layers are formed in an nMOS transistor and a pMOS transistor by using a same metal material. After the whole of the layers are doped with nitrogen, nitrogen in one layer is made to out-diffuse. The other layer is covered so that nitrogen will not out-diffuse. By doing so, a metal gate electrode of the nMOS transistor differs from a metal gate electrode of the pMOS transistor in work function (see Japanese Unexamined Patent Publication No. 2005-79512).

However, if different metal materials are used for forming metal gate electrodes of an nMOS transistor and a pMOS transistor, the metal gate electrodes of the NMOS transistor and the pMOS transistor must be formed separately. As a result, a manufacturing process and device structure are complex compared with conventional devices. In addition, manufacturing costs rise.

If a same metal material is used for forming metal gate electrodes of an nMOS transistor and a pMOS transistor and the work functions of the metal gate electrodes are controlled by adjusting the dosage of nitrogen, the resistance of the metal gate electrodes becomes high, depending on their structure. In addition, a manufacturing process becomes complex. Such problems must be solved. Moreover, a proper work function difference which can practically be used for CMOS transistors is not obtained between metal gate electrodes of an nMOS transistor and a pMOS transistor and a method for obtaining a proper work function difference between metal gate electrodes of an nMOS transistor and a pMOS transistor is not yet devised.

SUMMARY

A method for manufacturing a semiconductor device according to an aspect of the present invention forming a gate insulating film over a semiconductor layer in an nMOS transistor formation region and a pMOS transistor formation region, forming a work function control layer in which nitrogen concentration in the nMOS transistor formation region differs from nitrogen concentration in the pMOS transistor formation region over the gate insulating film, forming a low-resistance layer which contains nitrogen over the work function control layer, and performing heat treatment for diffusing nitrogen from the low-resistance layer into the work function control layer.

DETAILED DESCRIPTION OF THE EMBODIMENTS

Embodiments of the present invention will now be described in detail with reference to the drawings.

Figure 1:
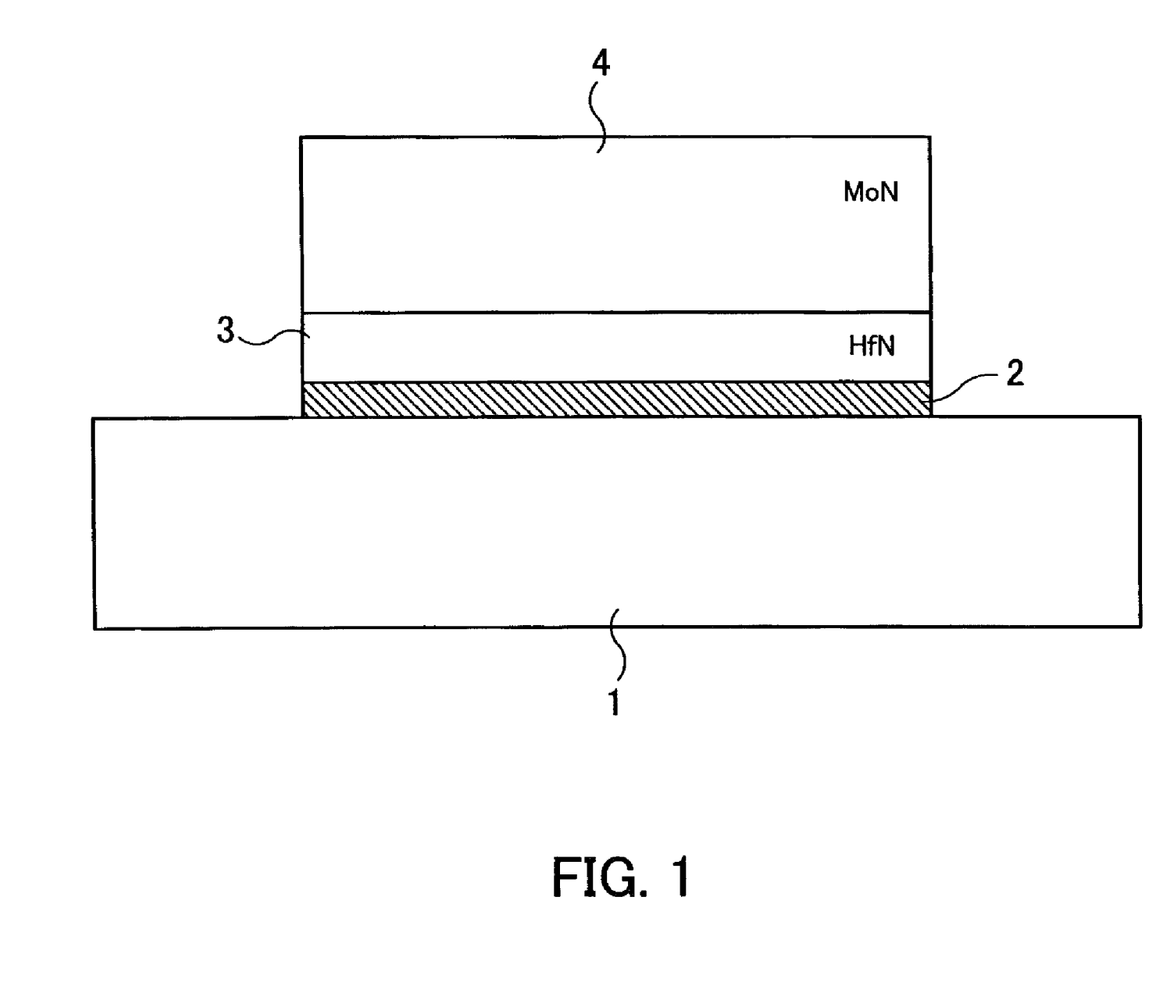
FIG. 1 is a view showing an example of the construction of a MOS structure in which a metal gate electrode is used.

With a MOS structure shown in FIG. 1, a hafnium nitride (HfN) layer 3 is formed over a silicon (Si) substrate 1 with a gate insulating film 2 between. A molybdenum nitride (MoN) layer 4 is formed over the HfN layer 3. As a result, a laminated metal gate electrode including the lower HfN layer 3 and the upper MoN layer 4 is used in the MOS structure shown in FIG. 1.

In this laminated metal gate electrode, the lower HfN layer 3 functions as a layer (work function control layer) for controlling a work function and the upper MoN layer 4 functions as a layer (low-resistance layer) for lowering the resistance of the metal gate electrode. A high-dielectric-constant (high-k) material, such as hafnium oxide ($HfO_2$) or hafnium silicate (HfSiO), can be used in place of silicon oxide ($SiO_2$) for forming the gate insulating film 2.

It is assumed that CMOS transistors are fabricated by using the MOS structure shown in FIG. 1.

According to the conventional methods, the work function of the HfN layer 3 of an nMOS transistor and the work function of the HfN layer 3 of a pMOS transistor are controlled by setting nitrogen concentration in the HfN layer 3 of the nMOS transistor and the HfN layer 3 of the pMOS transistor to different values. However, if the conventional methods are used, nitrogen concentration in the HfN layer 3 may change because of heat treatment which is performed later. For example, nitrogen concentration in the HfN layer 3 may change because of impurity activation anneal or the like which is performed at the time of forming source/drain regions.

Figure 2:
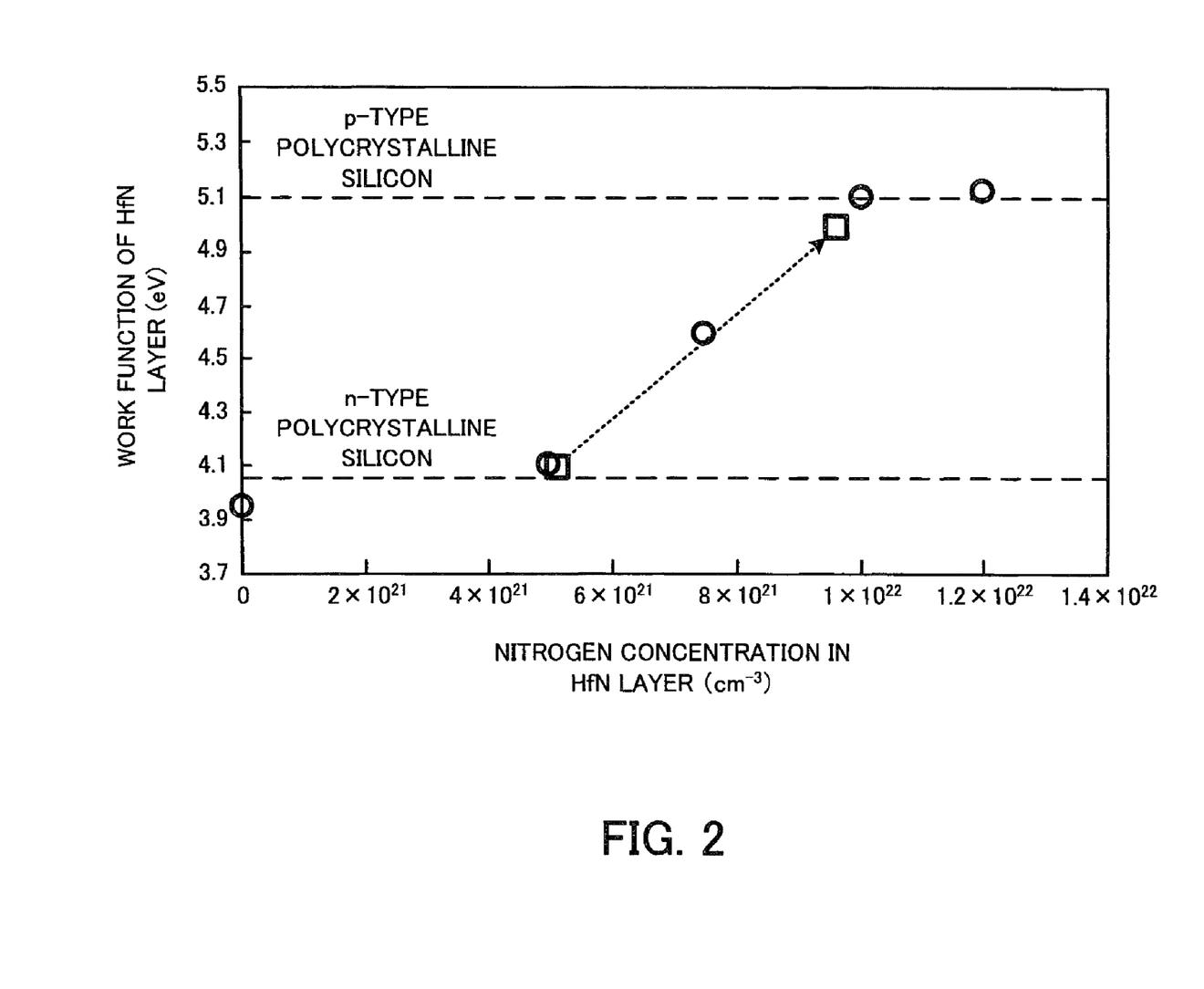
FIG. 2 is a view showing an example of the relationship between nitrogen concentration in a HfN layer and the work function of the HfN layer.

FIG. 2 is a view showing an example of the relationship between nitrogen concentration in the HfN layer and the work function of the HfN layer. In FIG. 2, a horizontal axis indicates nitrogen concentration ($cm^{-3}$) in the HfN layer and a vertical axis indicates the work function (eV) of the HfN layer. The work functions of an n-type polycrystalline silicon gate electrode and a p-type polycrystalline silicon gate electrode are also shown in FIG. 2.

As shown in FIG. 2, the work function of the HfN layer 3 tends to increase with an increase in nitrogen concentration in the HfN layer 3. In particular, the work function of the HfN layer 3 changes considerably when nitrogen concentration in the HfN layer 3 is in the range of about $5\times10^{21}$ to $1\times10^{22}$ $cm^{-3}$. It is assumed that the metal gate electrode of each CMOS transistor has the MOS structure shown in FIG. 1. When nitrogen concentration in the HfN layer 3 of the metal gate electrode of the NMOS transistor is about $5\times10^{21}$ $cm^{-3}$ or less and nitrogen concentration in the HfN layer 3 of the metal gate electrode of the pMOS transistor is about $1\times10^{22}$ $cm^{-3}$ or more, a work function difference which is equal to that obtained by using polycrystalline silicon gate electrodes in an nMOS transistor and a pMOS transistor can be realized.

If the metal gate electrode of each CMOS transistor has the MOS structure shown in FIG. 1, then nitrogen concentration in the HfN layer 3 of the metal gate electrode of the nMOS transistor and nitrogen concentration in the HfN layer 3 of the metal gate electrode of the pMOS transistor should be set to, for example, about $5\times10^{21}$ and $1\times10^{22}$ $cm^{-3}$, respectively, with the work functions, the influence of the doping of nitrogen on the stability of the layer, and the resistance values taken into consideration.

As stated above, however, if the HfN layer 3 of the nMOS transistor in which nitrogen concentration is about $5\times10^{21}$ $cm^{-3}$ and the HfN layer 3 of the pMOS transistor in which nitrogen concentration is about $1\times10^{22}$ $cm^{-3}$ are formed in advance in this way and the MoN layer 4 that is uniform in composition is formed over the HfN layer 3, nitrogen concentration in the HfN layer 3 of the nMOS transistor in particular that has a lower nitrogen content changes considerably at the time of heat treatment and the work function of the HfN layer 3 of the nMOS transistor changes.

As shown by a dotted line in FIG. 2, for example, if nitrogen concentration in the HfN layer 3 is increased from about $5\times10^{21}$ $cm^{-3}$ to about $1\times10^{22}$ $cm^{-3}$ by predetermined heat treatment, the work function of the HfN layer 3 rises significantly. On the other hand, even if nitrogen concentration in the HfN layer 3 is increased from about $1\times10^{22}$ $cm^{-3}$, the work function of the HfN layer 3 hardly changes. As a result, there is no significant difference in work function between the metal gate electrodes of the nMOS transistor and the pMOS transistor.

Figure 3:
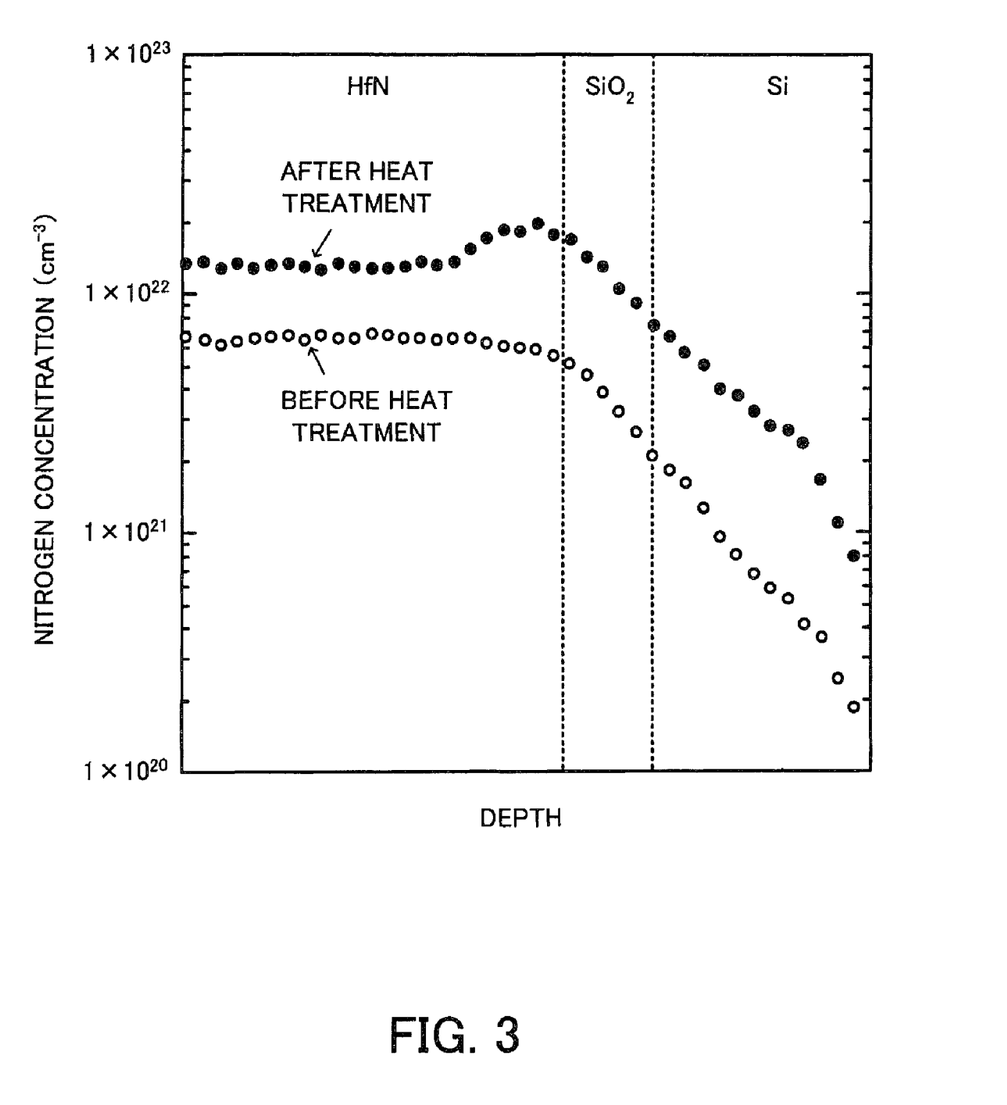
FIG. 3 is a nitrogen concentration profile of an nMOS transistor.
Figure 4:
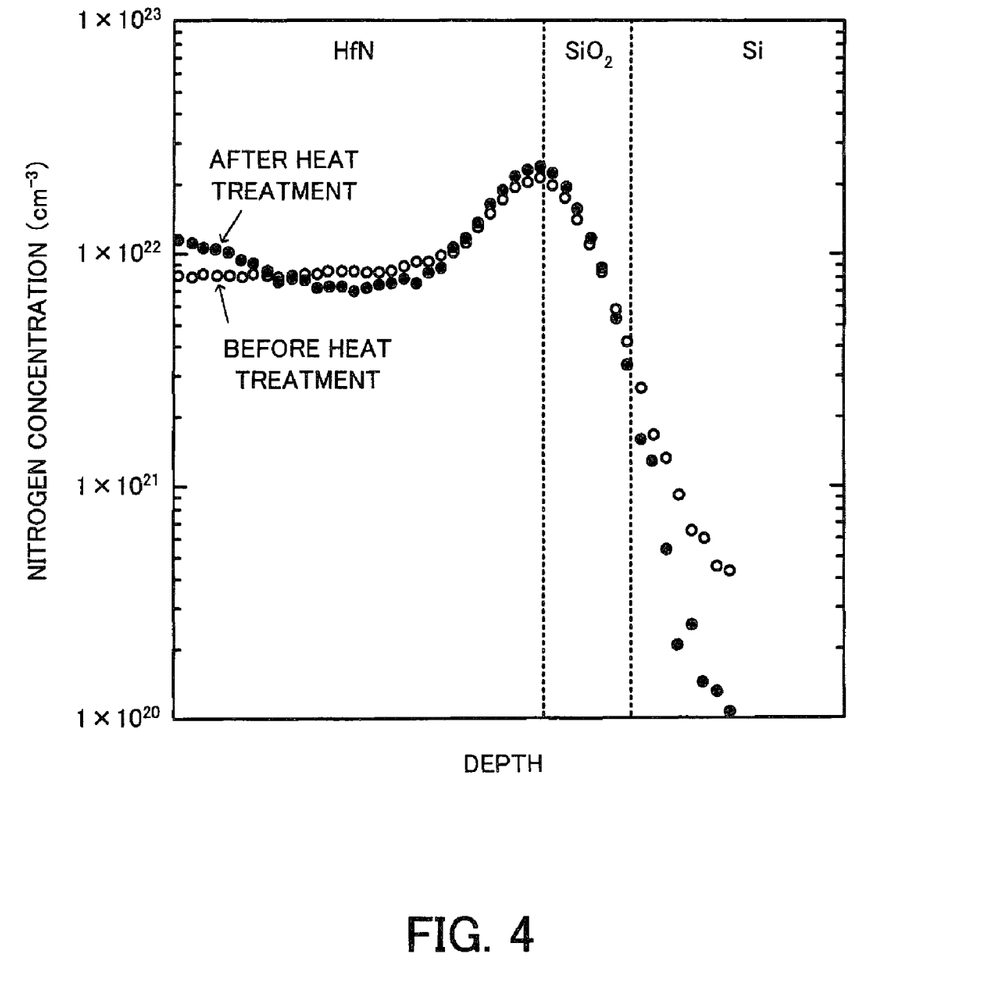
FIG. 4 is a nitrogen concentration profile of a pMOS transistor.

Each of FIGS. 3 and 4 shows an example of results obtained by measuring a nitrogen concentration profile before and after heat treatment by secondary ion mass spectrometry (SIMS). FIG. 3 is a nitrogen concentration profile of the nMOS transistor. FIG. 4 is a nitrogen concentration profile of the pMOS transistor. In each of FIGS. 3 and 4, a horizontal axis indicates depth and a vertical axis indicates nitrogen concentration ($cm^{-3}$).

It is assumed that the MOS structure shown in FIG. 1 is applied. As shown in FIG. 3, if nitrogen concentration in the HfN layer 3 of the nMOS transistor is about $5\times10^{21}$ $cm^{-3}$ before predetermined heat treatment, then nitrogen concentration in the HfN layer 3 of the nMOS transistor increases after the predetermined heat treatment. Therefore, a nitrogen concentration profile changes significantly. As shown in FIG. 4, on the other hand, a nitrogen concentration profile of the HfN layer 3 of the pMOS transistor hardly changes even after heat treatment which is performed under the same conditions.

Figure 5:
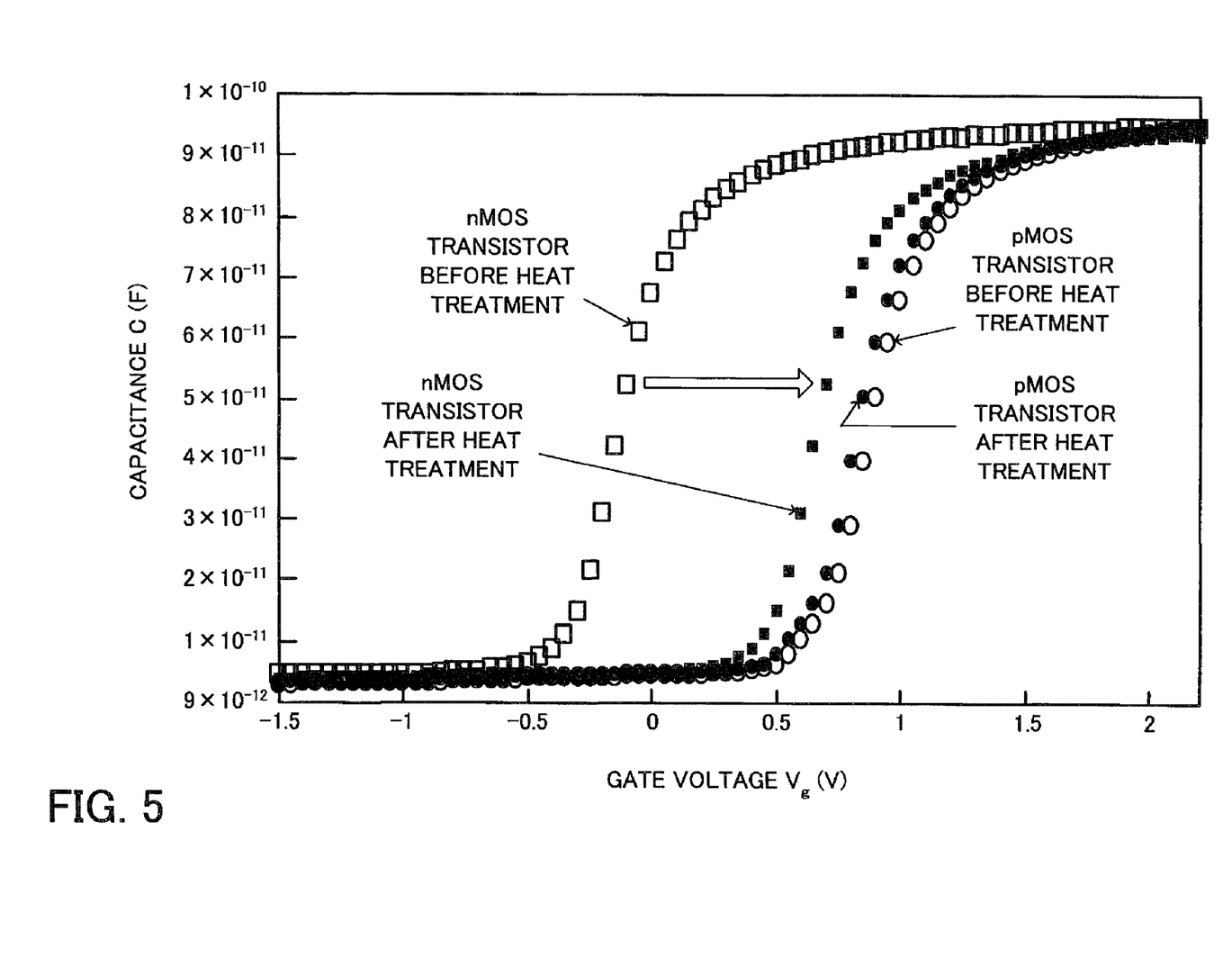
FIG. 5 is a view showing results obtained by measuring a capacitance-voltage characteristic before and after heat treatment.

FIG. 5 is a view showing results obtained by measuring a capacitance-voltage characteristic before and after the heat treatment. In FIG. 5, a horizontal axis indicates gate voltage $V_g$ (V) and a vertical axis indicates capacitance C (F).

As shown in FIG. 5, with the nMOS transistor in which nitrogen concentration in the HfN layer 3 changes significantly after the predetermined heat treatment, a C-V curve shifts not a little in the direction indicated by an arrow. In other words, this heat treatment changes the flat band voltage $V_{FB}$ of the nMOS transistor. As a result, the threshold voltage $V_{th}$ of the nMOS transistor changes. As shown in FIG. 5, on the other hand, with the pMOS transistor a C-V curve hardly shifts even after the predetermined heat treatment. Accordingly, it may safely be said that the flat band voltage $V_{FB}$ of the pMOS transistor, that is to say, the threshold voltage $V_{th}$ of the pMOS transistor hardly changes even after the heat treatment.

The above change in nitrogen concentration in the HfN layer 3 of the nMOS transistor is caused by the thermal diffusion of nitrogen from the MoN layer 4 formed over the HfN layer 3. That is to say, with the nMOS transistor nitrogen contained in the MoN layer 4 diffuses into the HfN layer 3 formed under the MoN layer 4 because of the heat treatment. Nitrogen concentration in the HfN layer 3 increases, so the work function changes. With the pMOS transistor, on the other hand, a certain amount of nitrogen is already contained in the HfN layer 3 before the heat treatment. Accordingly, even after the MoN layer 4 is formed over the HfN layer 3 and the heat treatment is performed, a change in nitrogen concentration hardly occurs. As a result, the work function hardly changes.

Therefore, to efficiently fabricate CMOS transistors each having a laminated metal gate electrode including the HfN layer 3 and the MoN layer 4 with great accuracy, nitrogen concentration in each layer must be optimized in each step.

Figure 6:
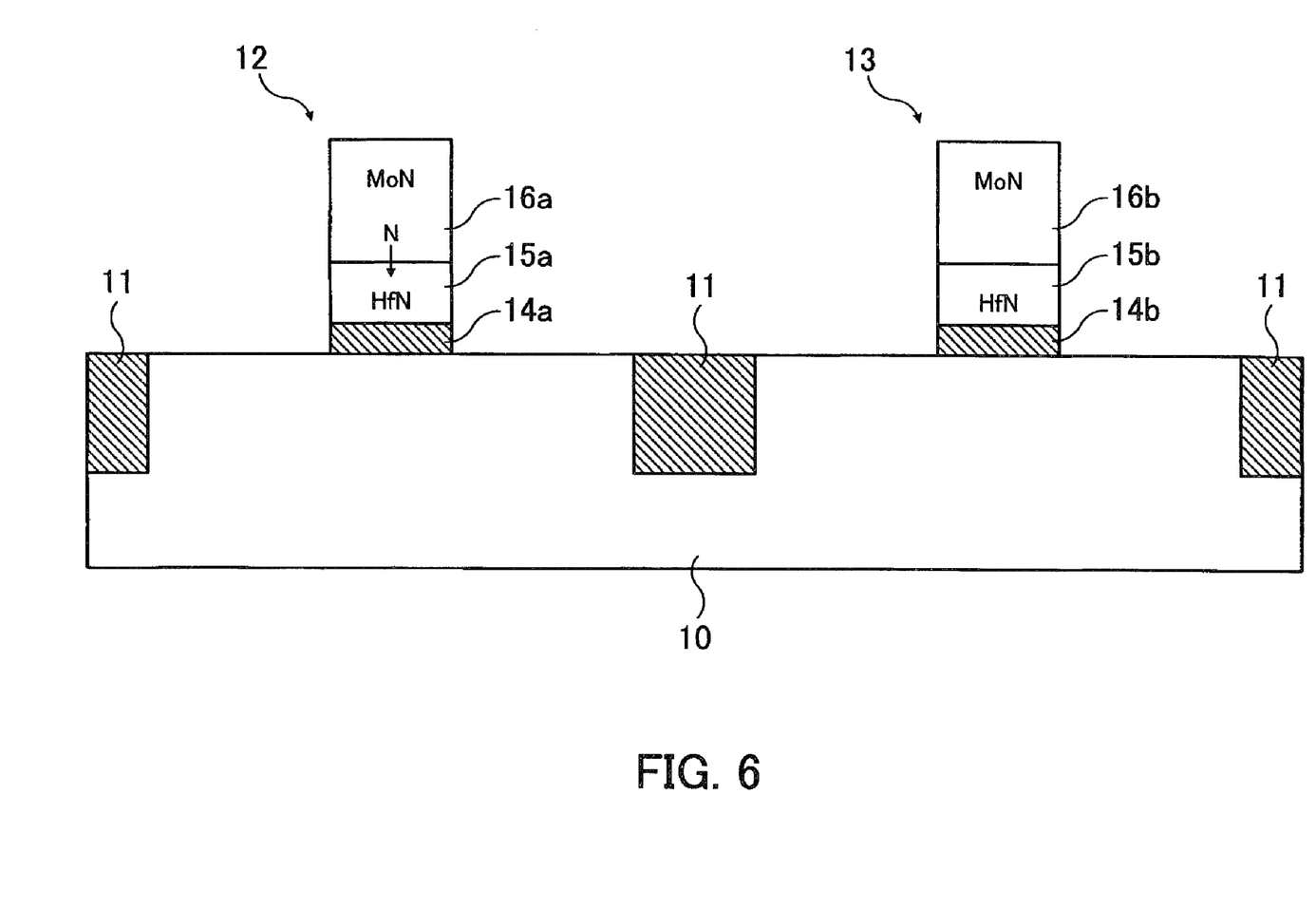
FIG. 6 is a view for describing the principles underlying a method for fabricating CMOS transistors each having a laminated metal gate electrode.

FIG. 6 is a view for describing the principles underlying a method for fabricating CMOS transistors each having a laminated metal gate electrode.

In FIG. 6, a section of an important part in the process for fabricating CMOS transistors is schematically shown. Isolation regions 11 are formed in a Si substrate 10 and an nMOS transistor formation region 12 is isolated from a pMOS transistor formation region 13. In the nMOS transistor formation region 12 a HfN layer 15a and a MoN layer 16a are formed over the Si substrate 10 with a gate insulating layer 14a between to form a metal gate electrode. Similarly, in the pMOS transistor formation region 13 a HfN layer 15b and a MoN layer 16b are formed over the Si substrate 10 with a gate insulating layer 14b between to form a metal gate electrode.

When the above laminated metal gate electrodes are formed, the following phenomena are used for controlling the work functions. In the NMOS transistor formation region 12 nitrogen diffuses at the time of heat treatment from the MoN layer 16a into the HfN layer 15a in which nitrogen concentration is low. In the pMOS transistor formation region 13, however, nitrogen hardly diffuses at the time of heat treatment from the MoN layer 16b into the HfN layer 15b in which nitrogen concentration is high and in which a certain amount of nitrogen is already contained.

That is to say, nitrogen concentration in the HfN layer 15a formed in the NMOS transistor formation region 12 is set in advance to a value lower than nitrogen concentration which is necessary to realize almost the same work function that is obtained in the case of using an n-type polycrystalline silicon gate electrode. On the other hand, nitrogen concentration in the HfN layer 15b formed in the PMOS transistor formation region 13 is set in advance to a value which is necessary to realize almost the same work function that is obtained in the case of using a p-type polycrystalline silicon gate electrode. In other words, nitrogen concentration in the HfN layer 15b formed in the pMOS transistor formation region 13 is set in advance to a value under which nitrogen hardly diffuses from the MoN layer 16b.

After that, heat treatment is performed. As a result, nitrogen diffuses from the MoN layer 16a into the HfN layer 15a in the nMOS transistor formation region 12 and a work function corresponding to nitrogen concentration which depends on the amount of nitrogen contained in the HfN layer 15a before the heat treatment and the amount of nitrogen that diffuses from the MoN layer 16a is obtained. At this time the amount of nitrogen contained in advance in the HfN layer 15b formed in the pMOS transistor formation region 13 makes it difficult for nitrogen to diffuse from the MoN layer 16b. Accordingly, the nitrogen content of the HfN layer 15b hardly changes before and after the heat treatment and a work function which approximately corresponds to nitrogen concentration in the HfN layer 15b before the heat treatment is obtained.

Nitrogen concentration in the HfN layer 15a before the heat treatment is set with conditions under which the heat treatment is performed taken into consideration.

For example, nitrogen concentration in the HfN layer 15a formed in the NMOS transistor formation region 12 is set to about $1\times10^{21}$ cm$^{-3}$ and nitrogen concentration in the HfN layer 15b formed in the pMOS transistor formation region 13 is set to about $1\times10^{22}$ cm$^{-3}$. The MoN layers 16a and 16b in which nitrogen concentration is about $4\times10^{21}$ cm$^{-3}$ are then formed over the HfN layers 15a and 15b, respectively, and the predetermined heat treatment is performed. Relationships which exist at this time between nitrogen concentration in the HfN layer 15a and the work function of the HfN layer 15a and between nitrogen concentration in the HfN layer 15b and the work function of the HfN layer 15b are shown in FIG. 7.

Figure 7:
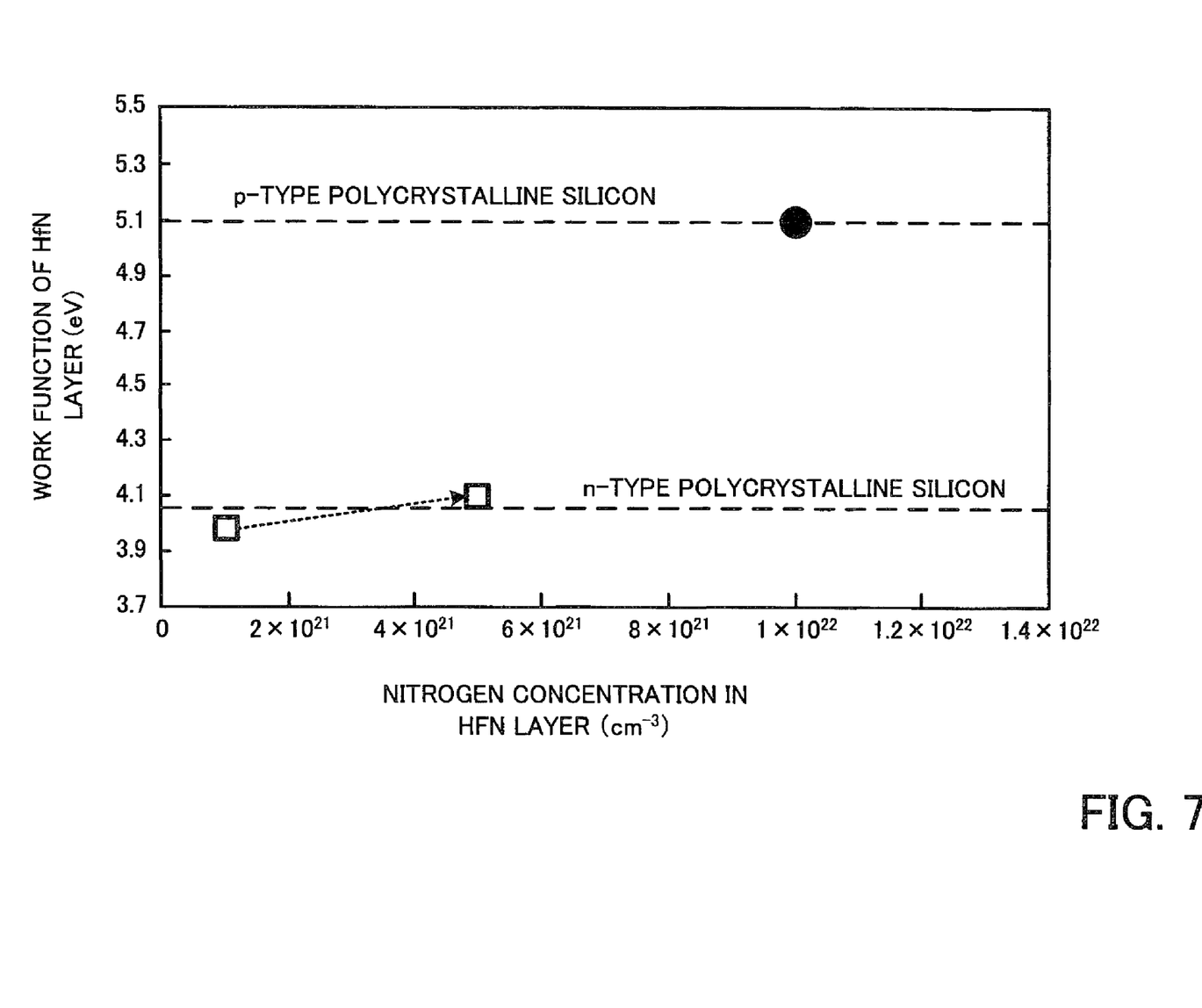
FIG. 7 is a view showing an example of relationship which exists between nitrogen concentration in a HfN layer and the work function of the HfN layer in the case of adjusting nitrogen concentration in the HfN layer before heat treatment.

FIG. 7 is a view showing an example of relationship which exists between nitrogen concentration in the HfN layer and the work function of the HfN layer in the case of adjusting nitrogen concentration in the HfN layer before the heat treatment. In FIG. 7, a horizontal axis indicates nitrogen concentration (cm$^{-3}$) in the HfN layer and a vertical axis indicates the work function (eV) of the HfN layer. The work functions of an n-type polycrystalline silicon gate electrode and a p-type polycrystalline silicon gate electrode are also shown in FIG. 7. This is the same with the above FIG. 2.

As shown in FIG. 7, nitrogen concentration in the HfN layer 15a formed in the NMOS transistor formation region 12 is about $1\times10^{21}$ cm$^{-3}$ before the heat treatment and becomes about $5\times10^{21}$ cm$^{-3}$ after the heat treatment. The work function of the HfN layer 15a is about 4.1 eV. Accordingly, almost the same work function that is obtained in the case of using an n-type polycrystalline silicon gate electrode is maintained even after the heat treatment. The heat treatment hardly causes nitrogen diffusion in the pMOS transistor formation region 13, so nitrogen concentration in the HfN layer 15b and the work function of the HfN layer 15b hardly change.

Therefore, if this method is adopted, metal gate electrodes can be formed in the nMOS transistor formation region 12 and the pMOS transistor formation region 13 by using the same kind of metal. In addition, by properly controlling nitrogen concentration in each layer before the heat treatment, low-resistance metal gate electrodes between which there is a predetermined significant difference in work function can be formed in the nMOS transistor formation region 12 and the PMOS transistor formation region 13.

To be concrete, on the basis of FIG. 7 nitrogen concentration in each layer should be set as follows. Nitrogen concentration in the HfN layer 15a formed in the nMOS transistor formation region 12 is set to about $1\times10^{21}$ cm$^{-3}$ or less, nitrogen concentration in the HfN layer 15b formed in the pMOS transistor formation region 13 is set to about $1\times10^{22}$ cm$^{-3}$ or more, and nitrogen concentration in the MoN layers 16a and 16b is set to about $4\times10^{21}$ cm$^{-3}$ or less. After that, the predetermined heat treatment is performed. By doing so, metal gate electrodes between which there is a significant difference in work function can be formed in the nMOS transistor formation region 12 and the pMOS transistor formation region 13. As a result, high performance CMOS transistors each having a metal gate electrode can be realized.

An Hf layer which does not contain nitrogen may be used in place of the HfN layer 15a as a layer for controlling the work function of the metal gate electrode formed in the NMOS transistor formation region 12 before the heat treatment is performed. In this case, however, the Hf layer may react with the gate insulating film 2, depending on a material for the gate insulating film 2, conditions under which the heat treatment is performed later, or the like. Accordingly, attention must be paid. If the Hf layer does not react with the gate insulating film 2 or if a problem does not arise when the Hf layer reacts with the gate insulating film 2, then the Hf layer can be used as a work function control layer.

If nitrogen concentration in the HfN layer 15b which is a layer for controlling the work function of the metal gate electrode formed in the pMOS transistor formation region 13 is about $1\times10^{22}$ cm$^{-3}$ or more, almost the same work function that is obtained in the case of using a p-type polycrystalline silicon gate electrode can be realized. In this case, however, an increase in nitrogen concentration causes an increase in the resistance of the HfN layer 15b. Accordingly, attention must be paid.

The method for fabricating CMOS transistors by using the above principles will now be described more concretely.

Figure 8:
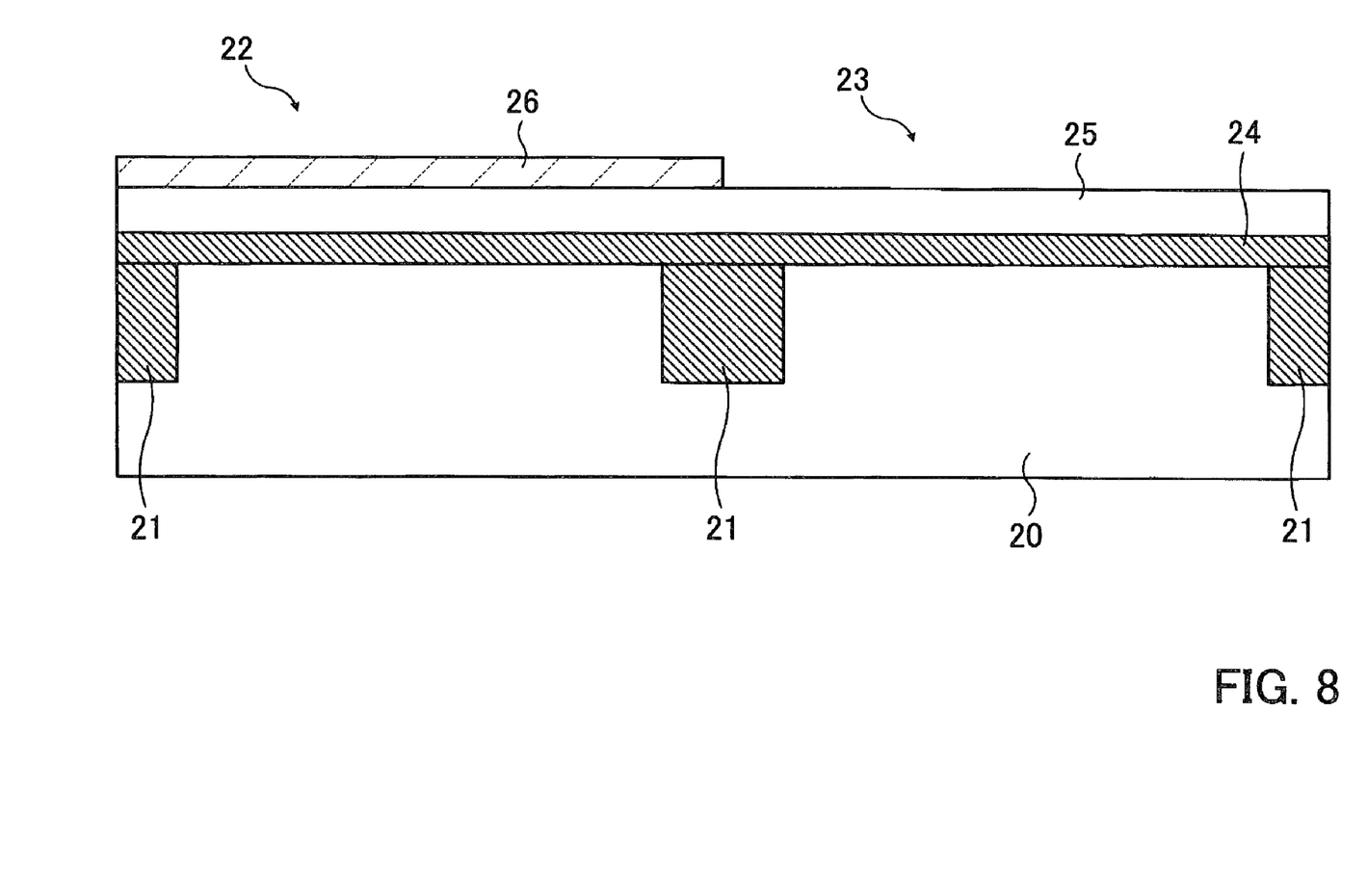
FIG. 8 is a fragmentary schematic sectional view showing the step of forming a HfN layer.
Figure 9:
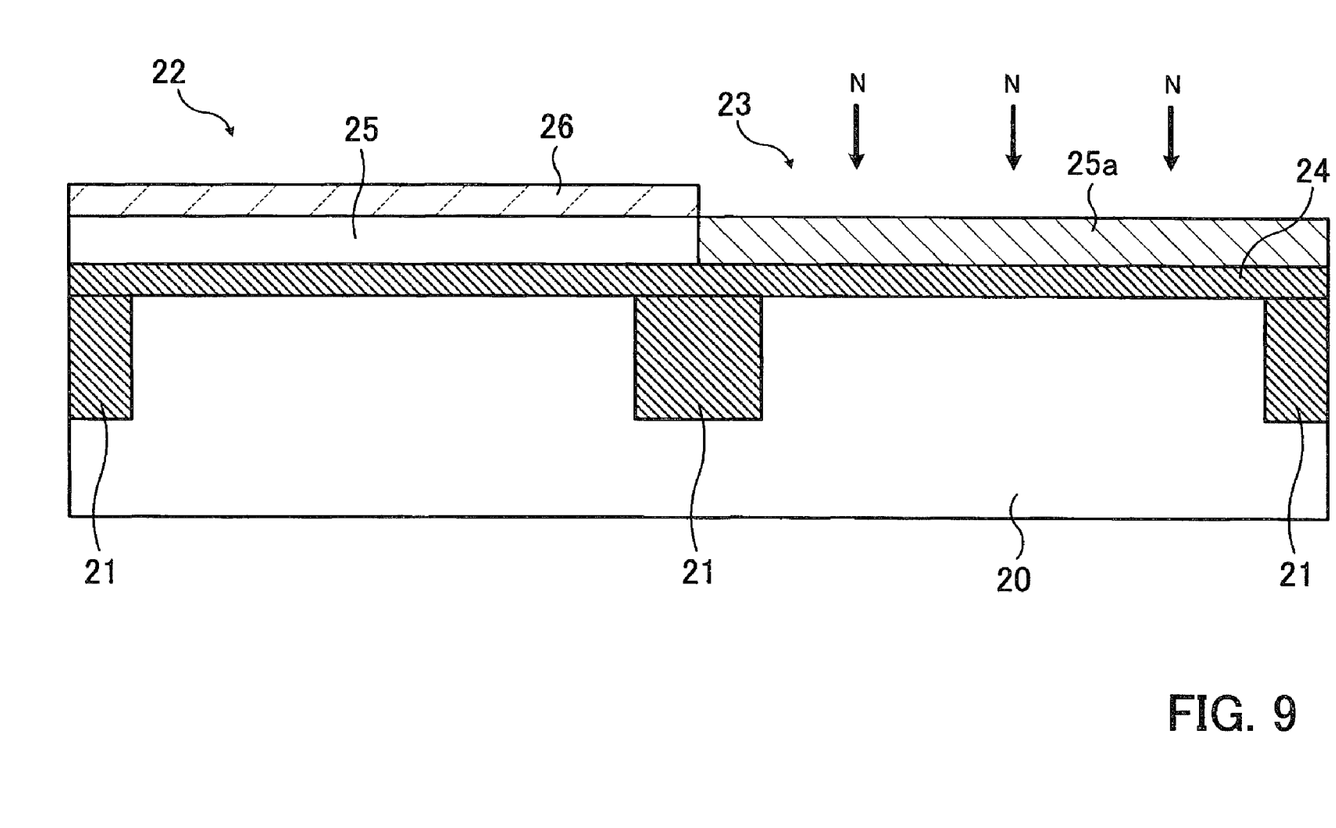
FIG. 9 is a fragmentary schematic sectional view showing the step of introducing nitrogen.
Figure 10:
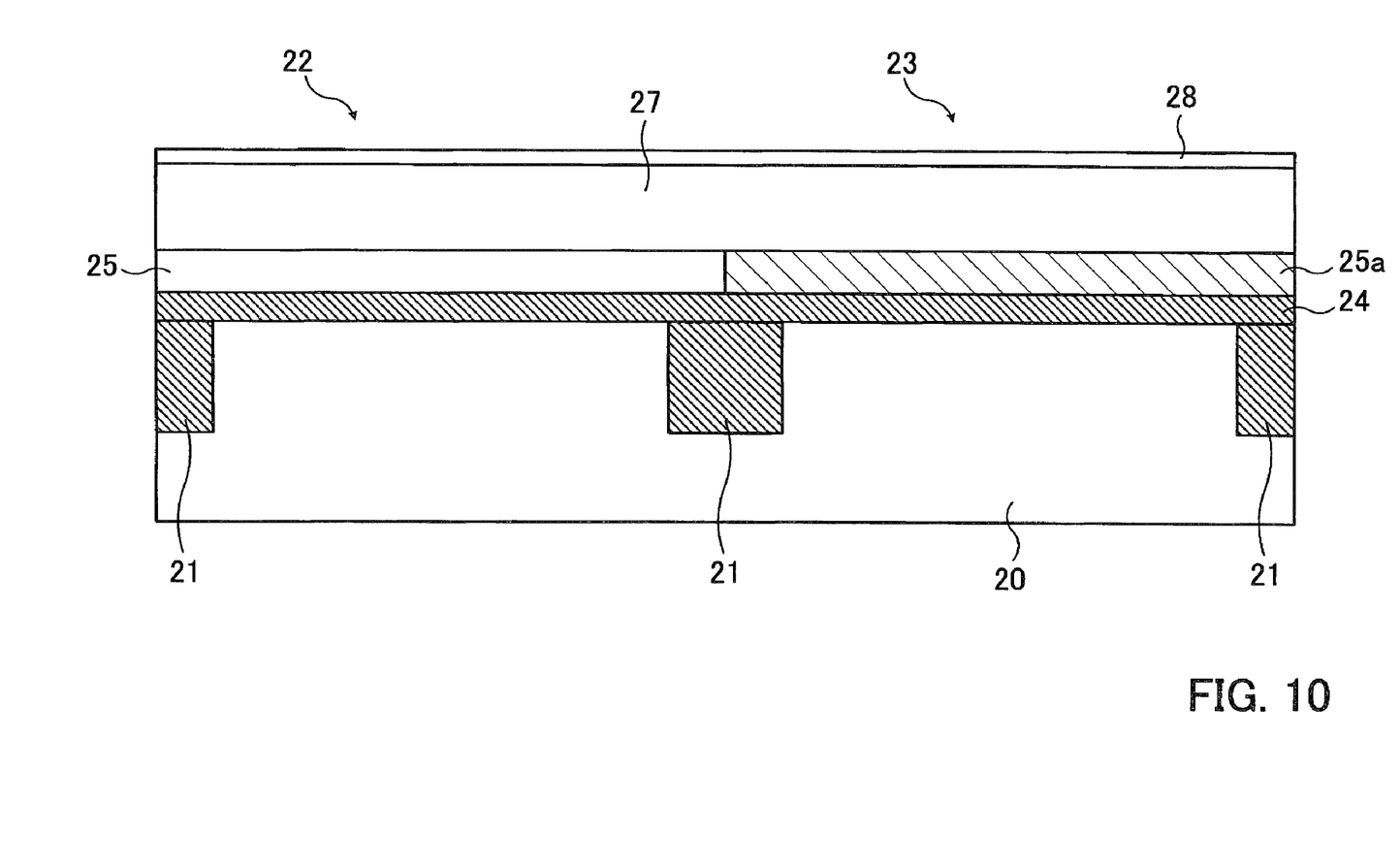
FIG. 10 is a fragmentary schematic sectional view showing the step of forming a MoN layer.
Figure 11:
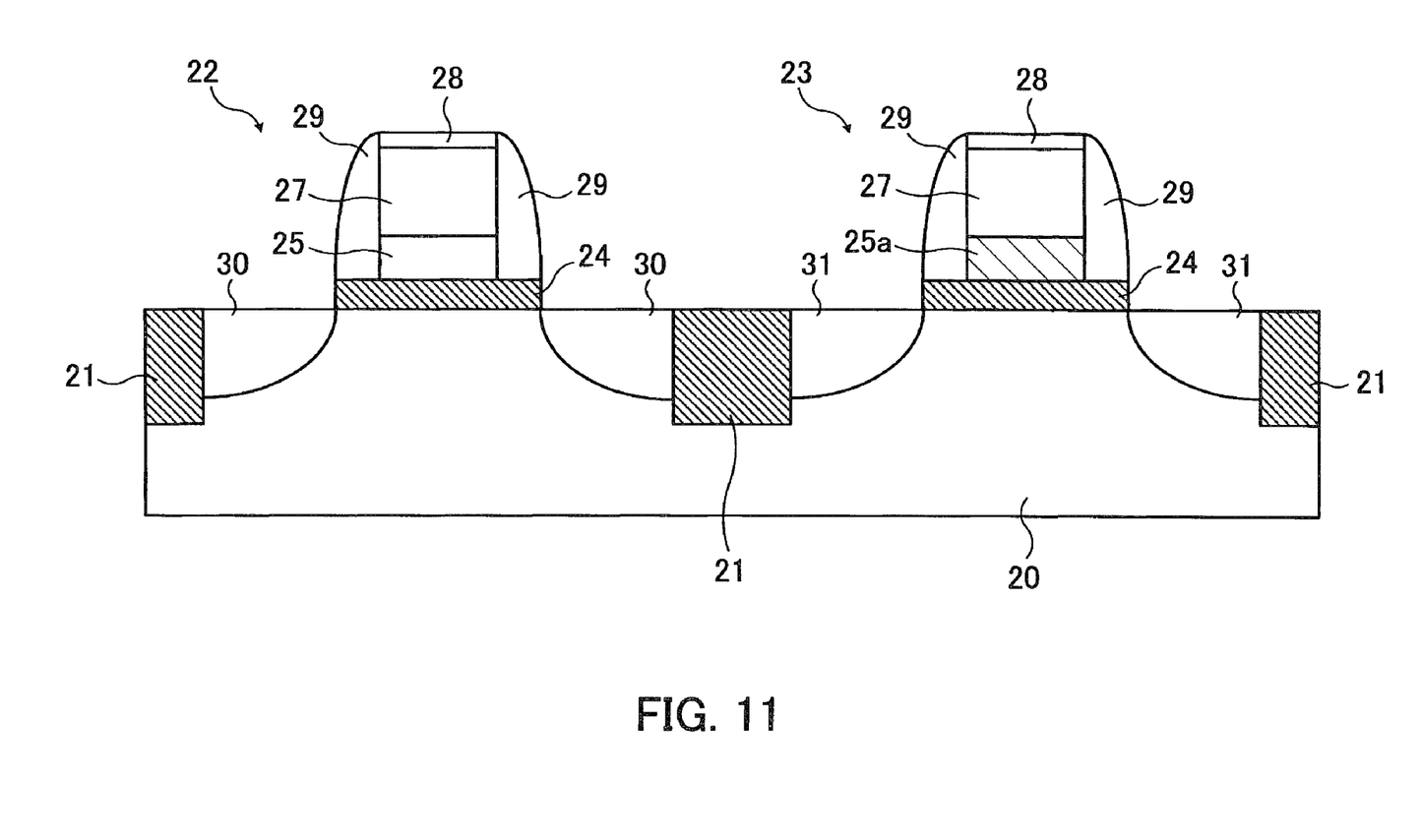
FIG. 11 is a fragmentary schematic sectional view showing the step of forming a side wall.
Figure 12:
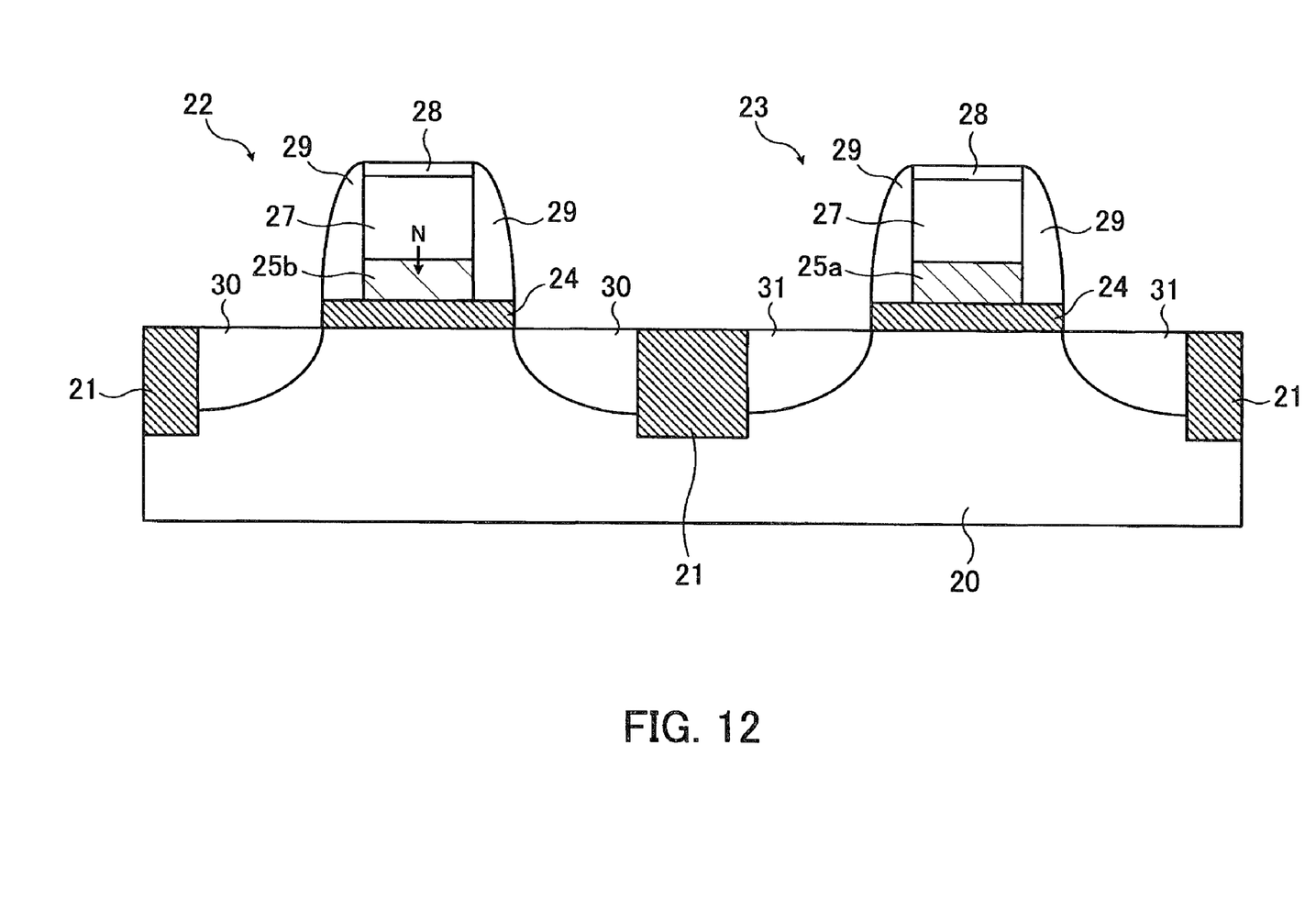
FIG. 12 is a fragmentary schematic sectional view showing an activation anneal step.

FIGS. 8 through 12 are views for describing the method for fabricating CMOS transistors. FIG. 8 is a fragmentary schematic sectional view showing the step of forming a HfN layer. FIG. 9 is a fragmentary schematic sectional view showing the step of introducing nitrogen. FIG. 10 is a fragmentary schematic sectional view showing the step of forming a MoN layer. FIG. 11 is a fragmentary schematic sectional view showing the step of forming a side wall. FIG. 12 is a fragmentary schematic sectional view showing an activation anneal step.

As shown in FIG. 8, an ordinary method is used first. That is to say, isolation regions 21 are formed in a Si substrate 20 by a shallow trench isolation (STI) method or the like to define an nMOS transistor formation region 22 and a pMOS transistor formation region 23. After that, a well region (not shown) and a gate insulating film 24 are formed. The gate insulating film 24 is formed over the Si substrate 20 by using $SiO_2$, $HfO_2$, HfSiO, or the like. In this case, a thermal oxidation method, a chemical vapor deposition (CVD) method, or the like should be used according to a material for the gate insulating film 24.

A HfN layer 25 with a thickness of about 20 nm in which nitrogen concentration is about $1\times10^{21}$ $cm^{-3}$ is then formed over the entire surface of the Si substrate 20 by, for example, a sputtering method or the CVD method. If the sputtering method is used, then the HfN layer 25 with a desired concentration of nitrogen can be formed by controlling nitrogen concentration in an atmosphere in which Hf is sputtered. If the CVD method is used, then the HfN layer 25 with a desired concentration of nitrogen can be formed by controlling the flow rate of $N_2$ gas introduced into a chamber with a material for Hf.

In this example, the thickness of the HfN layer 25 is set to about 20 nm. However, it is desirable that the thickness of the HfN layer 25 should be set to 20 nm or more. If the HfN layer 25 is thinner than 20 nm, then the possibility that nitrogen implanted will pierce through the HfN layer 25 in a nitrogen ion implantation step described later becomes higher. However, this depends on conditions under which ion implantation is performed.

After the HfN layer 25 is formed, the HfN layer 25 in the nMOS transistor formation region 22 is covered with photoresist 26 and the HfN layer 25 only in the PMOS transistor formation region 23 gets exposed.

As shown in FIG. 9, nitrogen ions are then implanted in the HfN layer 25 only in the pMOS transistor formation region 23 with the photoresist 26 as a mask to form a HfN layer 25a with a higher concentration of nitrogen. At this time the dosage of nitrogen ions implanted in the HfN layer 25 shown in FIG. 8 should be controlled so that nitrogen concentration in the HfN layer 25a formed by performing ion implantation in the pMOS transistor formation region 23 will be about $1\times10^{22}$ $cm^{-3}$. After the nitrogen ion implantation is performed, the photoresist 26 in the nMOS transistor formation region 22 is removed.

By performing the above steps, the HfN layer 25 in which nitrogen concentration is about $1\times10^{21}$ $cm^{-3}$ remains in the nMOS transistor formation region 22 and the HfN layer 25a in which nitrogen concentration is about $1\times10^{22}$ $cm^{-3}$ is formed in the pMOS transistor formation region 23.

As shown in FIG. 10, a MoN layer 27 with a thickness of about 80 nm in which nitrogen concentration is about $4\times10^{21}$ $cm^{-3}$ is then formed over an entire surface by, for example, the sputtering method or the CVD method. If the sputtering method is used, then the MoN layer 27 with a desired concentration of nitrogen can be formed by controlling nitrogen concentration in an atmosphere in which Mo is sputtered. If the CVD method is used, then the MoN layer 27 with a desired concentration of nitrogen can be formed by controlling the flow rate of $N_2$ gas introduced into a chamber with a material for Mo.

In addition, a Si film 28 with a thickness of about 10 nm is formed over the MoN layer 27 formed in this way by, for example, the sputtering method or the CVD method. The Si film 28 prevents the MoN layer 27 formed in advance from oxidizing and suppresses an increase in resistance value.

After the Si film 28 is formed, etching is performed first to leave the Si film 28, the MoN layer 27, and the HfN layers 25 and 25a included in portions in the nMOS transistor formation region 22 and the pMOS transistor formation region 23 to be used as metal gate electrodes. After that, a silicon nitride (SiN) film is formed over an entire surface and an etch-back is performed. By doing so, as shown in FIG. 11, side walls 29 are formed on the sides of the metal gate electrodes formed in the nMOS transistor formation region 22 and the pMOS transistor formation region 23 and the exposed gate insulating film 24 is removed.

After the side walls 29 are formed, an ordinary method is used. That is to say, ions are implanted in the exposed Si substrate 20 under predetermined conditions to form source/drain regions 30 and 31 in the Si substrate 20 on both sides of the metal gate electrodes in the nMOS transistor formation region 22 and the pMOS transistor formation region 23 respectively.

Finally, activation anneal of impurities implanted in the source/drain regions 30 and 31 is performed. For example, rapid thermal anneal (RTA) is performed as activation anneal in an atmosphere of an inert gas at a temperature of about 1000° C. for about 10 seconds.

By performing activation anneal in this way, in the nMOS transistor formation region 22 nitrogen contained in the MoN layer 27 formed over the HfN layer 25 is introduced into the HfN layer 25 as a result of thermal diffusion. Accordingly, as shown in FIG. 12, a HfN layer 25b with a higher concentration of nitrogen is formed. At this time nitrogen concentration in the HfN layer 25b ultimately becomes about $5\times10^{21}$ $cm^{-3}$ as a result of the thermal diffusion of nitrogen from the MoN layer 27 in which nitrogen concentration is about $4\times10^{21}$ $cm^{-3}$ into the HfN layer 25 in which nitrogen concentration is about $1\times10^{21}$ $cm^{-3}$. In the pMOS transistor formation region 23, on the other hand, the thermal diffusion of nitrogen from the MoN layer 27 formed over the HfN layer 25a into the HfN layer 25a hardly occurs. Accordingly, nitrogen concentration in the HfN layer 25a hardly changes from about $1\times10^{22}$ $cm^{-3}$. As a result, nitrogen concentration in the MoN layer 27 in the nMOS transistor formation region 22 becomes $2\times10^{21}$ $cm^{-3}$ and nitrogen concentration in the MoN layer 27 in the pMOS transistor formation region 23 is $4\times10^{21}$ $cm^{-3}$. That is to say, nitrogen concentration in the MoN layer 27 in the pMOS transistor formation region 23 hardly changes. Therefore, a nitrogen concentration difference of about $2\times10^{21}$ $cm^{-3}$ arises between the MoN layer 27 in the nMOS transistor formation region 22 and the MoN layer 27 in the pMOS transistor formation region 23.

By performing the above steps, the HfN layer 25b in which nitrogen concentration is about $5\times10^{21}$ $cm^{-3}$ is formed in the nMOS transistor formation region 22 and the HfN layer 25a in which nitrogen concentration is about $1\times10^{22}$ $cm^{-3}$ is formed in the pMOS transistor formation region 23.

As shown in FIG. 7, if such a relationship exists between nitrogen concentrations in the HfN layers 25b and 25a of the metal gate electrodes of an nMOS transistor and a pMOS transistor, respectively, which are CMOS transistors, then a significant difference in work function can be ensured between the metal gate electrodes of the nMOS transistor and the pMOS transistor. Accordingly, a low-resistance metal gate electrode having a predetermined work function can be formed and high performance CMOS transistors can be realized.

It is desirable that a difference in work function between the metal gate electrodes of the nMOS transistor and the pMOS transistor should be 0.8 V or more. The merit of setting a difference in work function to 0.8 V or more is that it is easy to fabricate CMOS transistors which can be applied to various devices, more particularly to high performance devices. However, even if a difference in work function is smaller than 0.8 V, it is a matter of course that CMOS transistors which can be applied to various devices can be fabricated.

By adopting the above fabrication method, CMOS transistors between which a work function difference of 0.8 V or more is obtained can be fabricated. In addition, metal gate electrodes can be formed in an nMOS transistor formation region and a pMOS transistor formation region by using the same kind of metal material. Therefore, compared with the case where metal gate electrodes are formed in an nMOS transistor formation region and a pMOS transistor formation region by using different metal materials, the process does not become complex and the number of the steps performed does not increase. As a result, high performance CMOS transistors each having a metal gate electrode can be fabricated efficiently.

As stated above, an Hf layer may be used in the above fabrication method as a work function control layer of the nMOS transistor before the heat treatment is performed. In this case, CMOS transistors can be fabricated by performing, for example, the following steps.

That is to say, a gate insulating film 24 is formed first over a Si substrate 20 in which isolation regions 21 are formed. An Hf layer is formed over the gate insulating film 24 in place of the above HfN layer 25 (see FIG. 8). In this case, however, the gate insulating film 24 should be formed by using a material which does not react with hafnium contained in the Hf layer or which hardly reacts with hafnium contained in the Hf layer. For example, a silicon oxide nitride (SiON) film or a hafnium silicon oxynitride (HfSiON) film which contains nitrogen should be formed as the gate insulating film 24. After that, the same steps that are performed in the case of using the above HfN layer 25 are followed. That is to say, after an nMOS transistor formation region 22 is covered with photoresist 26 (see FIG. 8), nitrogen ions are implanted in the Hf layer which gets exposed in a pMOS transistor formation region 23 (see FIG. 9). After that, a MoN layer 27, a Si film 28, side walls 29, and source/drain regions 30 and 31 are formed (see FIGS. 10 and 11) and activation anneal is performed (see FIG. 12).

However, the dosage of nitrogen ions implanted in the Hf layer must be set to a value which is higher than that of nitrogen ions implanted in the above HfN layer 25 to form an HfN layer 25a with a predetermined concentration of nitrogen. When the MoN layer 27 is formed, nitrogen concentration in the MoN layer 27 must be set so that after the activation anneal is performed, an HfN layer 25b with a predetermined concentration of nitrogen will be obtained from the Hf layer under the MoN layer 27 which does not contain nitrogen.

In the above fabrication methods the Si film 28 which is formed over the MoN layer 27 as a low-resistance layer for preventing the MoN layer 27 from oxidizing may ultimately be removed regardless of whether a work function control layer of the NMOS transistor before the heat treatment is the HfN layer 25 or the Hf layer. However, even if the Si film 28 is not removed, the Si film 28 usually reacts with the MoN layer 27 at the time of the activation anneal of the source/drain regions 30 and 31 to form silicide. Accordingly, continuity is ensured.

In the above examples descriptions of the thermal diffusion of nitrogen from the low-resistance layer into the work function control layer in the nMOS transistor formation region are mainly given. However, a predetermined work function difference may ultimately be obtained by adjusting nitrogen concentration in the fabrication process and causing the thermal diffusion of nitrogen from the low-resistance layer into the work function control layer both in the nMOS transistor formation region and in the pMOS transistor formation region.

Moreover, in the above examples HfN or Hf is used for forming a work function control layer. However, zirconium nitride (ZrN) or zirconium (Zr) may be used in place of HfN or Hf for forming a work function control layer. ZrN or Zr functions the same as HfN or Hf. In addition, the same effect that is obtained by using HfN or Hf can be achieved by using ZrN or Zr.

Furthermore, in the above examples MoN is used for forming a low-resistance layer. However, tungsten nitride (WN) may be used in place of MoN for forming a low-resistance layer. WN functions the same as MoN. In addition, the same effect that is obtained by using MoN can be achieved by using WN.

Moreover, in the above examples MOS transistors are fabricated by using a Si substrate. However, it is a matter of course that the same effect can be obtained by using a silicon on insulator (SOI) substrate or the like.

Furthermore, in the above examples RTA is performed after ion implantation at a temperature of about 1000° C. for about 10 seconds as impurity activation anneal. However, conditions under which activation anneal is performed are not limited to them. For example, activation anneal may be performed at a temperature of about 900° C. for about 1 to 2 minutes or at a temperature of about 600° C. for about 10 hours. The same effect can be obtained according to the above principles by performing activation anneal under these conditions. It is a matter of course that heat treatment is not limited to impurity activation anneal.

In the above descriptions each condition under which CMOS transistors are fabricated is an example. Each condition can arbitrarily be changed according to, for example, necessary characteristics of CMOS transistors to be fabricated.

In the present invention, the work function control layers with different concentrations of nitrogen are formed in the nMOS transistor formation region and the pMOS transistor formation region, the low-resistance layer which contains nitrogen is formed over the work function control layers, and heat treatment is performed. As a result, a metal gate electrode having a predetermined work function can be formed in each of the NMOS transistor formation region and the pMOS transistor formation region. Therefore, a complementary semiconductor device with low-resistance metal gate electrodes each having a proper work function can be realized. In addition, such a semiconductor device can efficiently be fabricated by performing a small number of steps.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for manufacturing a semiconductor device comprising:
    forming a gate insulating film over a semiconductor layer in an nMOS transistor formation region and a pMOS transistor formation region;
    forming a work function control layer in which nitrogen concentration in the nMOS transistor formation region is lower than nitrogen concentration in the pMOS transistor formation region over the gate insulating film;

forming a low-resistance layer which contains nitrogen over the work function control layer; and performing heat treatment for diffusing nitrogen from the low-resistance layer into the work function control layer; wherein the forming of the work function control layer comprises:

forming a first work function control layer having a first nitrogen concentration in the nMOS transistor formation region, the first nitrogen concentration is lower than a second nitrogen concentration at which a work function of a gate electrode of an nMOS transistor is obtained; and forming a second work function control layer having a third nitrogen concentration at which a work function of a gate electrode of a pMOS transistor is obtained in the pMOS transistor formation region, the third nitrogen concentration being higher than the second nitrogen concentration; and wherein after the heat treatment for diffusing nitrogen from the low-resistance layer into the work function control layer, the first work function control layer has the second nitrogen concentration and the second work function control layer has a nitrogen concentration higher than or equal to the third nitrogen concentration;

the first work function control layer and the second work function control layer include hafnium; and the low-resistance layer includes molybdenum nitride.

2. The method according to claim 1, wherein in the forming of the work function control layer, the first work function control layer and the second work function control layer are formed so that a difference of 0.8 V or more is obtained between work functions set after the heat treatment by the first work function control layer and the second work function control layer.

3. The method according to claim 1, wherein in the forming of the work function control layer, the first work function control layer and the second work function control layer are formed so that nitrogen concentration in the first work function control layer and nitrogen concentration in the second work function control layer become $5 \times 10^{21}$ cm$^{-3}$ or less and $1 \times 10^{22}$ cm$^{-3}$ or more, respectively, after the heat treatment.

4. The method according to claim 1, wherein:
in the forming of the work function control layer, nitrogen concentration in the second work function control layer is set to $1 \times 10^{22}$ cm$^{-3}$; and
in the forming of the low-resistance layer, nitrogen concentration in the low-resistance layer is set to $4 \times 10^{21}$ cm$^{-3}$ or less.

5. The method according to claim 1, wherein:
in the forming of the work function control layer, nitrogen concentration in the first work function control layer is set to $1 \times 10^{21}$ cm$^{-3}$; and
in the forming of the low-resistance layer, nitrogen concentration in the low-resistance layer is set to $4 \times 10^{21}$ cm$^{-3}$ or less.

6. The method according to claim 1, wherein in the heat treatment, nitrogen diffuses from the low-resistance layer into the work function control layer in which nitrogen concentration in the nMOS transistor formation region is lower than nitrogen concentration in the pMOS transistor formation region and the low-resistance layer in which nitrogen concentration in the nMOS transistor formation region differs from nitrogen concentration in the pMOS transistor formation region is formed.

* * * * *